(12) United States Patent
Terazawa (10) Patent No.: US 9,160,316 B2
(45) Date of Patent: Oct. 13, 2015

(54) DIGITAL CONTROLLED OSCILLATOR AND FREQUENCY VARIABLE OSCILLATOR

(71) Applicant: DENSO CORPORATION, Kariya, Aichi-pref. (JP)

(72) Inventor: Tomohito Terazawa, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/321,871

(22) Filed: Jul. 2, 2014

(65) Prior Publication Data

US 2015/0008986 A1 Jan. 8, 2015

(30) Foreign Application Priority Data

Jul. 4, 2013 (JP) .................................. 2013-140658

(51) Int. Cl.
*H03K 3/03* (2006.01)

(52) U.S. Cl.
CPC ..................................... *H03K 3/0315* (2013.01)

(58) Field of Classification Search
CPC .................................................... H03K 3/0322
USPC ................................................ 331/57, 45, 1 A
See application file for complete search history.

(56) References Cited

U.S. PATENT DOCUMENTS

| 5,477,196 A | 12/1995 | Yamauchi et al. |
| 5,525,939 A | 6/1996 | Yamauchi et al. |
| 6,424,192 B1 * | 7/2002 | Lee et al. ....................... 327/156 |
| 7,605,661 B2 * | 10/2009 | Sano .............................. 331/1 A |
| 2010/0327983 A1 | 12/2010 | Yamamoto |

FOREIGN PATENT DOCUMENTS

| JP | 07106923 A | 4/1995 |
| JP | H07-183800 A | 7/1995 |
| WO | 2009-104358 A1 | 8/2009 |

OTHER PUBLICATIONS

Office Action mailed Jun. 9, 2015 in the corresponding JP application No. 2013-140658 (with English translation).

* cited by examiner

*Primary Examiner* — Joseph Chang
(74) *Attorney, Agent, or Firm* — Posz Law Group, PLC (57) ABSTRACT

A digital controlled oscillator includes: a delay circuit which includes m elements transmitting a pulse signal with delay; a timing signal generator generating a timing signal corresponding to timing-selection data from passing signals, based on the timing-selection data specifying any of timings which are obtained by dividing a circulation period of the pulse signal by m×n; and an output signal generator which sets the timing-selection data based on control data specifying a period of an output pulse signal and the timing-selection data, and generates the output pulse signal based on the timing-selection data by using the timing signal. The timing signal generator generates the timings obtained by dividing the circulation period by m×n by using pulse edge shift circuits which generate n shift signals whose timings differ by a unit delay from one input signal, the unit delay being 1/n of delay time in the element.

7 Claims, 7 Drawing Sheets

FIG.7

DIGITAL CONTROLLED OSCILLATOR AND FREQUENCY VARIABLE OSCILLATOR

CROSS-REFERENCE TO RELATED APPLICATION

This application is based on and claims the benefit of priority from earlier Japanese Patent Application No. 2013-140658 filed Jul. 4, 2013, the description of which is incorporated herein by reference.

BACKGROUND OF THE INVENTION

1. Technical Field

The present invention relates to a digital controlled oscillator and a frequency variable oscillator which generate a signal having a desired frequency by using a ring delay circuit in which a plurality of delay element are connected in a ring shape.

2. Related Art

Conventionally, a digital controlled oscillator is known which generates an output pulse signal having a desired frequency by using a ring delay circuit (ring oscillator) in which a plurality of delay elements are connected in a ring shape (e.g. see JP-A-7-183800).

Specifically, the digital controlled oscillator uses a counter which counts the number of circulations of a pulse signal in the ring delay circuit and a selection circuit which selects any one of outputs of the delay elements (specifies a circulation position of a pulse in the ring delay circuit) to change a signal level of an output pulse signal by using a signal selected by the selection circuit every time when the pulse signal passes through multiple stages of delay elements, the number of the stages corresponding to the desired frequency (period).

However, according to the above conventional oscillator, the inverse of delay time in the delay elements configuring the ring delay circuit is frequency resolution of the output pulse signal. Hence, frequency resolution higher than the inverse of the delay time cannot be realized.

SUMMARY

An embodiment provides a digital controlled oscillator and a frequency variable oscillator which generate a desired frequency by using an output of a ring delay circuit and realize frequency resolution higher than frequency resolution determined by the delay time in a delay element.

As an aspect of the embodiment, a digital controlled oscillator is provided which includes: a ring delay circuit which includes delay elements connected in ring shape, the number of the delay elements being m (m is an integer of 2 or more), and which transmits a pulse signal with delay; a timing signal generation section which generates a timing signal corresponding to timing selection data from passing signals outputted from the delay elements, in accordance with the timing selection data specifying any of timings which are obtained by dividing a circulation period of the pulse signal in the ring delay circuit by m×n (n is an integer of 2 or more); and an output signal generation section which sets the timing selection data based on control data specifying a period of an output pulse signal and the timing selection data every time when the output pulse signal is outputted, and generates the output pulse signal in accordance with the timing selection data by using the timing signal outputted from the timing signal generation section. The timing signal generation section generates the timings obtained by dividing the circulation period by m×n by using at least one pulse edge shift circuit which generates shift signals, the number of which is n, and whose timings differ from each other by a unit delay time from one input signal, the unit delay time being 1/n of delay time in the delay element.

DETAILED DESCRIPTION OF THE PREFERRED EMBODIMENTS

With reference to the accompanying drawings, hereinafter are described some embodiments of the present invention.

First Embodiment

Overall Configuration

Figure 1:
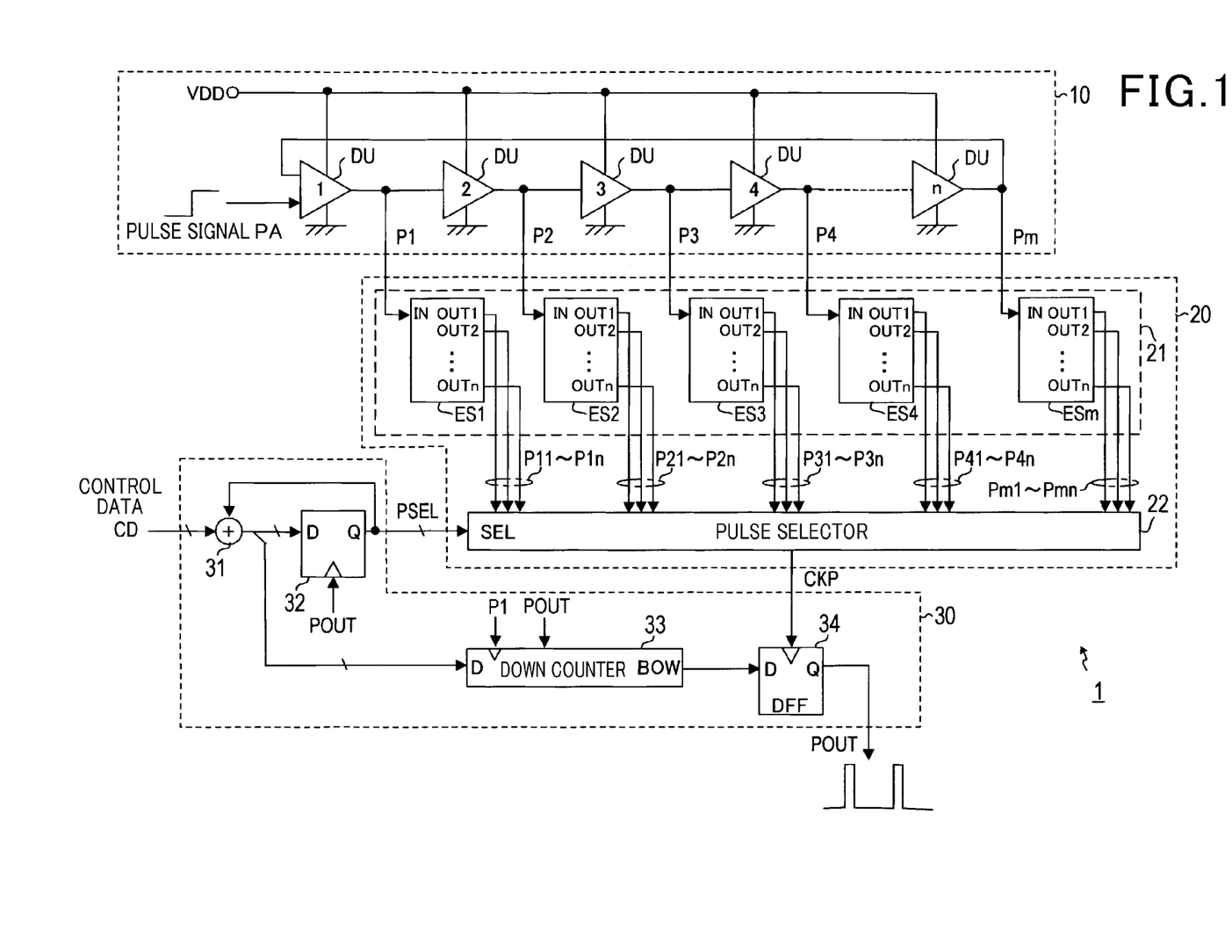
FIG. 1 is a diagram showing an overall configuration of a digital controlled oscillator according to a first embodiment.

As shown in FIG. 1, a digital controlled oscillator 1 includes a ring delay circuit 10, a timing signal generation section 20, and an output signal generation section 30.

<Ring Delay Circuit>

The ring delay circuit 10 includes delay elements DU connected in a ring shape so that a pulse signal can circulate, the number of the delay elements DU being m (m=$2^p$, p is a positive integer). Each of the delay elements DU is configured by connecting one or more stages of CMOS inverter gate circuits (two stages in the present embodiment).

Note that the ring delay circuit 10 in FIG. 1 schematically shows a connection state of the delay elements DU. In practice, a configuration for generating a pulse signal PA for activating the ring delay circuit 10 (that is, for starting circulation of a pulse signal), and a configuration for continuing circulation of a pulse signal by returning the signal level to a low level before a rising edge arrives again are provided. Since these configurations are known techniques (e.g. see JP-A-7-183800), explanations thereof are omitted. Hereinafter, delay time in the delay element DU is expressed by Td.

<Timing Signal Generation Section>

The timing signal generation section 20 generates a timing signal CKP corresponding to timing selection data PSEL by using passing signals P1 to Pm outputted from the delay elements DU configuring the ring delay circuit 10, in accordance with the timing selection data PSEL specifying any of timings which are obtained by dividing a circulation period (m×Td) of the pulse signal in the ring delay circuit 10 by m×n (n=$2^q$, q is a positive integer).

Figure 2A:
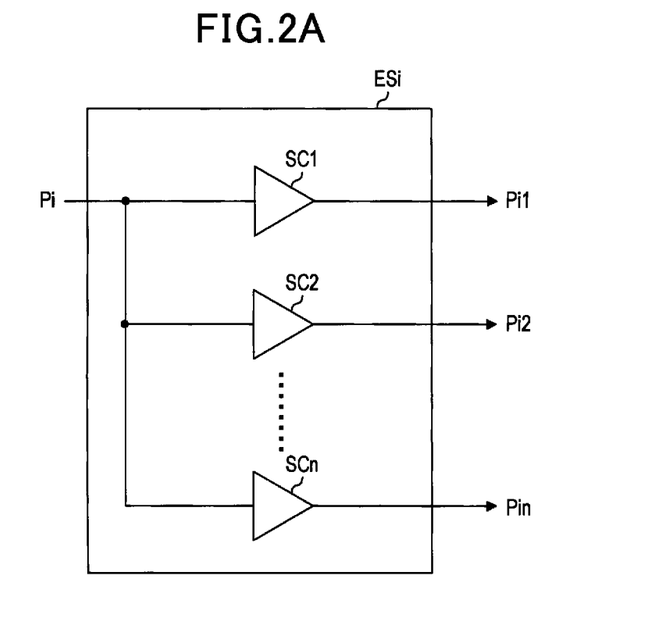
FIG. 2A is a circuit diagram showing a configuration of a pulse edge shift circuit.
Figure 2B:
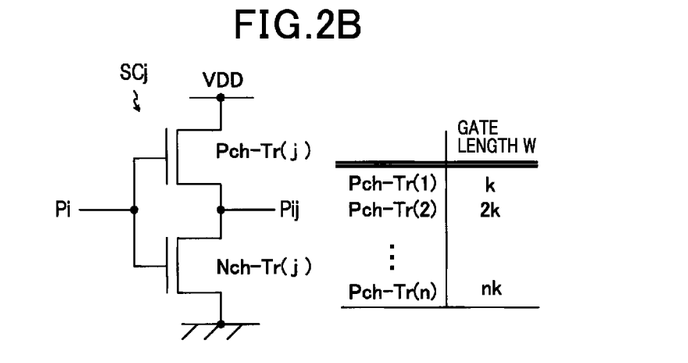
FIG. 2B is an explanatory drawing showing a configuration of a shift mount adjustment element and a method for setting a shift amount.
Figure 3:
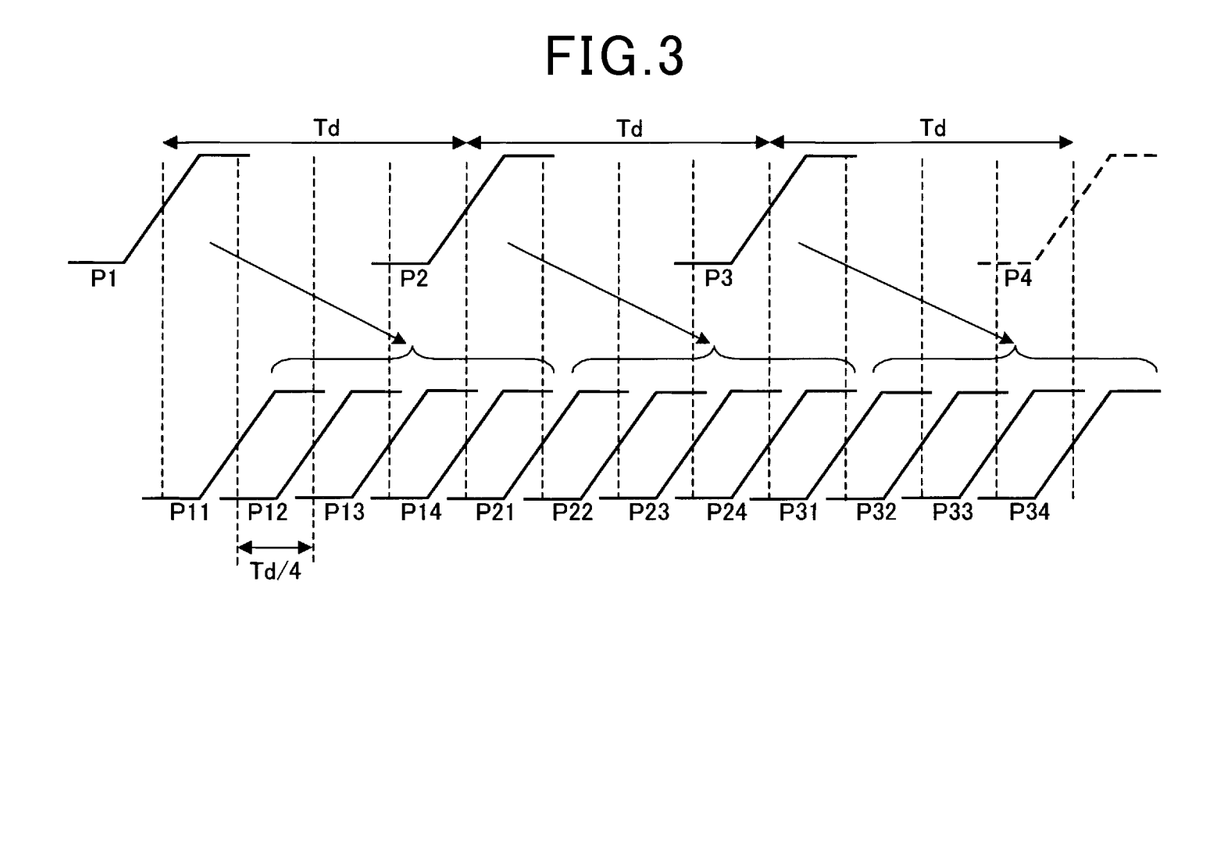
FIG. 3 is a timing diagram showing an operation of a timing signal generation section.

The timing signal generation section 20 includes a shift signal generation section 21 and a pulse selector 22. The shift signal generation section 21 includes pulse edge shift circuits ES1 to ESm, the number of which is m, and which are provided for the respective passing signals P1 to Pm and generate shift signals Pi1 to Pin, the number of which is n, from the passing signals Pi (i=1, 2, . . . , m). As shown in FIG. 2A, the pulse edge shift circuit ESi is configured by shift amount adjustment elements SC1 to SCn, the number of which is n. The shift amount adjustment elements SC1 to SCn receive the passing signals Pi (i=1, 2, . . . , m). In the shift amount adjustment elements SC1 to SCn, shift amounts (the amounts of delay) are different from each other by 1/n of the amount of delay Td in the delay element DU. In addition, as shown in FIG. 2B, the shift amount adjustment element SCj (j=1, 2, . . . , n) is configured by a CMOS inverter gate circuit. The amount of shift is set to a desired value by adjusting the gate length W of a P-channel transistor configuring the CMOS inverter gate circuit. Specifically, if the gate length W by which the amount of shift becomes Td/n is defined as k, the gate length of the shift amount adjustment element SCj is set to Wj=j×k. Hence, for example, if n=4 (q=2) is determined, the relationship between the passing signals Pi (In FIG. 1, P1 to P4) and the shift signals Pi1 to Pi4 are shown in FIG. 3.

The pulse selector 22 selects any one of shift signals P11 to Pmn generated by the shift signal generation section 21, the number of which is m×n (=$2^{p+q}$), in accordance with timing selection data PSEL which is expressed by (p+q) bits provided from the output signal generation section 30, to output the selected shift signal Pij as a timing signal CKP to the output signal generation section 30.

<Output Signal Generation Section>

As shown in FIG. 1, the output signal generation section 30 includes an adder 31, a first latch circuit 32, a down counter 33, and a second latch circuit 34.

The adder 31 adds the timing selection data PSEL provided to the timing signal generation section 20 to control data CD expressing a period of an output pulse signal POUT.

The first latch circuit 32 is configured by a D-type flip-flop circuit which latches data of low-order (p+q) bits (hereinafter, also referred to as "low-order data") in an addition result of the adder 31 at the timing of a rising edge of the output pulse signal POUT. The first latch circuit 32 outputs the latched data as the timing selection data PSEL.

The down counter 33 loads data of high-order bits (hereinafter, also referred to as "circulation number data") in the addition result of the adder 31 except the low-order data at the timing of a rising edge of the output pulse signal POUT. The down counter 33 down-counts the passing signal P1 as a clock input. In addition, the down counter 33 outputs a borrow signal BOW which becomes a high level when counted out (when the count value reaches zero) and which is reset to a low level when the circulation number data is loaded.

The second latch circuit 34 is configured by a D-type flip-flop circuit which latches the borrow signal BOW at the timing of a rising edge of the timing signal CKP. The second latch circuit 34 outputs the latched data as the output pulse signal POUT.

Figure 4:
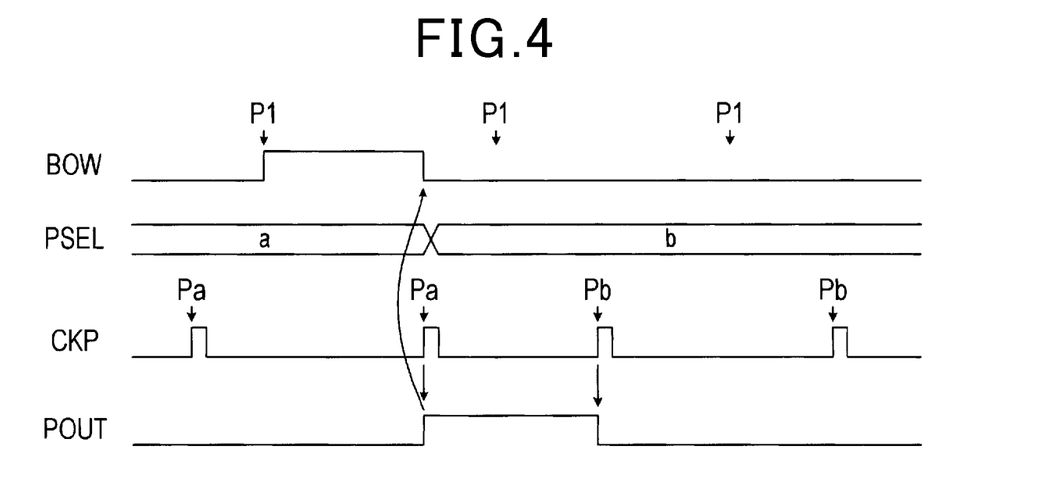
FIG. 4 is a timing diagram showing an operation of an output signal generation section.

Hereinafter, an operation of the output signal generation section 30 configured as described above is described with reference to a timing diagram shown in FIG. 4.

While the timing selection data PSEL is a (a is a value for specifying i, j), the timing signal generation section 20 outputs the timing signal CKP at the timing of a shift signal Pa. When the down counter 33 counts out (when the count value reaches zero), the borrow signal BOW changes to a high level at the timing of the passing signal P1. Immediately after the change, at the timing of the timing signal CKP (i.e. at the timing of the shift signal Pa), the output pulse signal POUT changes to a high level. Then, according to the change of the output pulse signal POUT, the first latch circuit 32 latches low-order data of the output of the adder 31. Thereby, the timing selection data PSEL is updated (the timing selection data PSEL is changed from a to b). In addition, high-order data (circulation number data) of the adder 31 is loaded as a count value of the down counter 33. Hence, the timing of the timing signal CKP outputted from the timing signal generation section 20 changes from the timing of the shift signal Pa to the timing of the shift signal Pb. In addition, the borrow signal BOW outputted from the down counter 33 is reset to a low level.

Thereafter, at the timing of the initial timing signal CKP (i.e. at the timing of the shift signal Pb), the output pulse signal POUT changes to a low level. Thereafter, the output pulse signal POUT is kept in the low level until the timing of the timing signal CKP immediately after the borrow signal BOW has changed to a high level again.

Hence, the output pulse signal POUT having a period obtained by multiplying a unit delay time by control data CD is generated, the unit delay time being 1/n of the delay time Td in the delay element DU.

<Advantages>

As described above, in the digital controlled oscillator 1, the shift signals Pi1 to Pin, whose shift amounts (the amounts of delay) are different from each other by Td/n, from the passing signals Pi which are outputs of the delay elements DU of the ring delay circuit 10 by using the pulse edge shift circuits ESi. Thereby, the number of timings which can be selected when generating the output pulse signal POUT is increased by a factor of n compared with a case where only the passing signals P1 to Pm are used. Hence, according to the digital controlled oscillator 1, n-fold frequency resolution can be realized which is n times higher than the frequency resolution determined by the delay time Td in the delay element DU.

In addition, according to the digital controlled oscillator 1, all the devices can be configured by digital circuits. Hence, compared with a configuration having analog circuits and digital circuits, the circuit area and power consumption can be decreased, and an operation at a higher temperature is possible. In addition, in the future, further miniaturization and higher resolution of the digital controlled oscillator can be realized as finer design rules in the integration technology develops.

Second Embodiment

Differences from the First Embodiment

Basic configurations of the second embodiment are the same as those of the first embodiment. Hence, descriptions of common configurations are omitted, and differences from the first embodiment are mainly described. Specifically, in the present embodiment, the configuration of a timing signal generation section 20a differs from that of the timing signal generation section 20 in the first embodiment.

<Timing Signal Generation Section>

Figure 5:
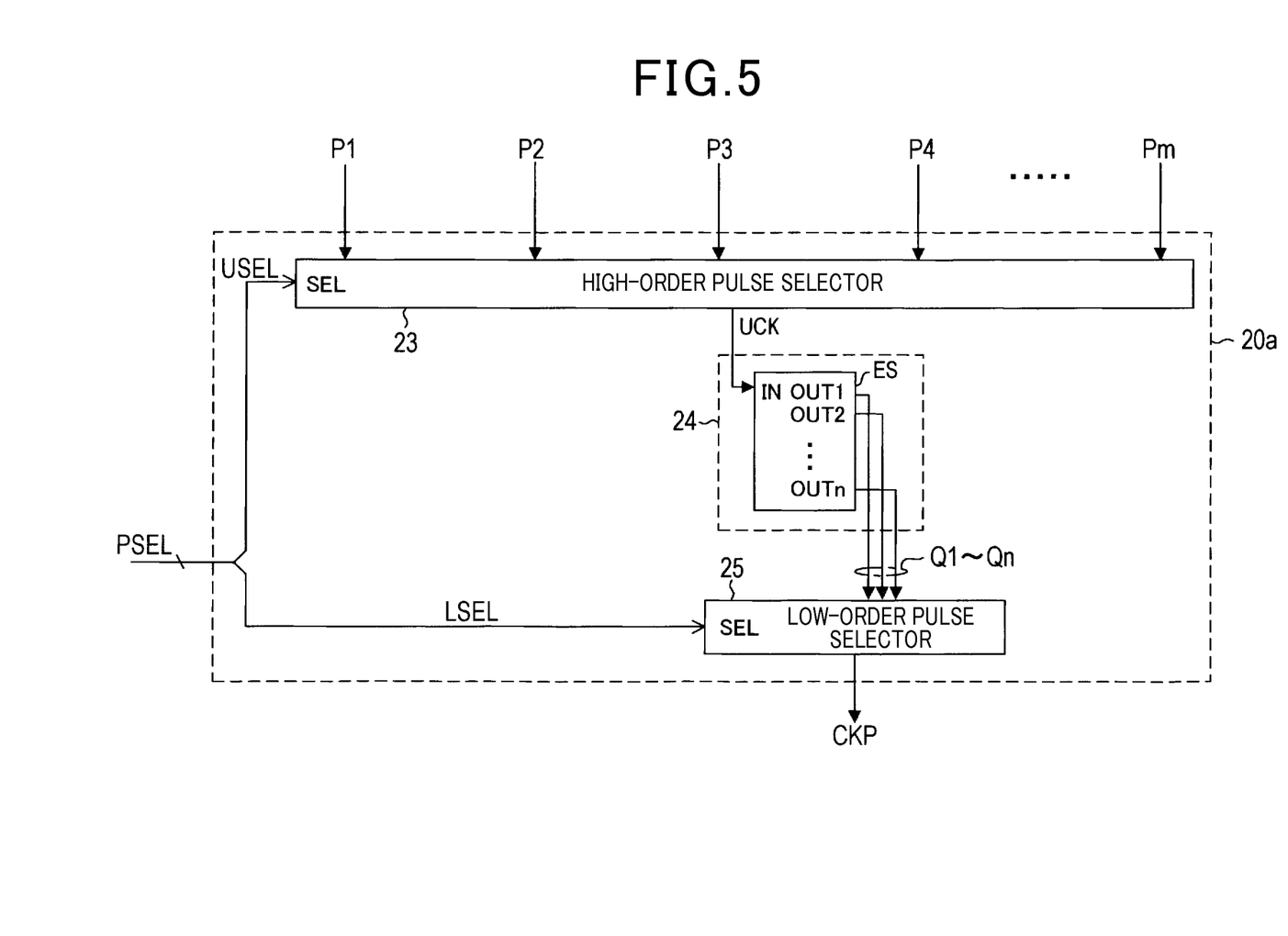
FIG. 5 is a circuit diagram showing a configuration of a timing signal generation section according to a second embodiment.

As shown in FIG. 5, the timing signal generation section 20a includes an high-order pulse selector 23, a shift signal generation section 24, and a low-order pulse selector 25.

The high-order pulse selector 23 selects any one of the passing signals P1 to Pm generated by the ring delay circuit 10, the number of which is m, in accordance with a high-order selection data USEL having high-order p bits included in the timing selection data PSEL which is expressed by (p+q) bits provided from the output signal generation section 30, to output the selected passing signal Pi as a high-order timing signal UCK.

The shift signal generation section 24 includes the pulse edge shift circuit ES configured as described in the first embodiment. The shift signal generation section 24 receives the high-order timing signal UCK outputted from the high-order pulse selector 23 and generates shift signals Q1 to Qn, whose amounts of delay are different from each other by 1/n of the amount of delay Td in the delay element DU.

The low-order pulse selector 25 selects any one of shift signals Q1 to Qn generated by the shift signal generation section 24, the number of which is n, in accordance with a low-order selection data LSEL having low-order q bits included in the timing selection data PSEL which is expressed by (p+q) bits provided from the output signal generation section 30, to output the selected shift signal Qi as the timing signal CKP.

<Advantages>

According to the present embodiment, advantages similar to those of the first embodiment can be obtained. In addition, compared with the first embodiment, the number of pulse edge shift circuits ES configuring the timing signal generation section 20a can be decreased. As a result, the configuration can be simplified.

Third Embodiment

In the first embodiment, the digital controlled oscillator 1 is explained which generates an output pulse signal POUT having a period (frequency) indicated in the control data CD according to the control data CD applied from an external unit. However, in the present embodiment, a frequency variable oscillator 2 is explained which measures a period of a reference signal PB and generates the control data CD by using reference period data DOUT, which is a result of the measurement.

<Overall Configuration>

Figure 6:
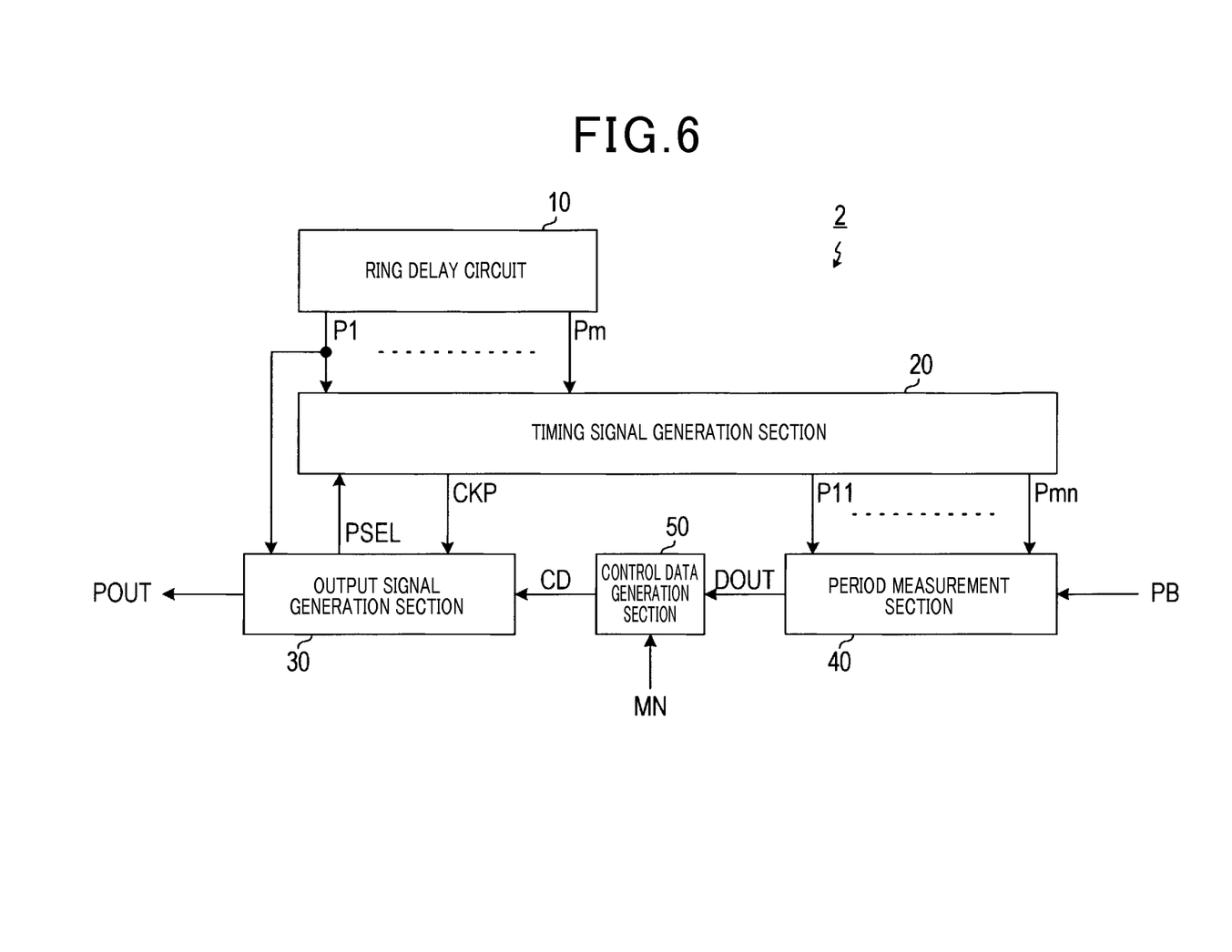
FIG. 6 is a diagram showing an overall configuration of a frequency variable oscillator according to a third embodiment.

As shown in FIG. 6, the frequency variable oscillator 2 includes the ring delay circuit 10, the timing signal generation section 20, the output signal generation section 30, a period measurement section 40, and a control data generation section 50. Since the ring delay circuit 10, the timing signal generation section 20, and the output signal generation section 30 are the same as those in the first embodiment, explanations thereof are omitted.

<Period Measurement Section>

The period measurement section 40 generates the reference period data DOUT, which is obtained by converting a phase difference between a rising edge and a successive rising edge of the reference signal PB received from an external unit to a binary digital value, based on the shift signals P11 to Pmn generated by the timing signal generation section 20.

Figure 7:
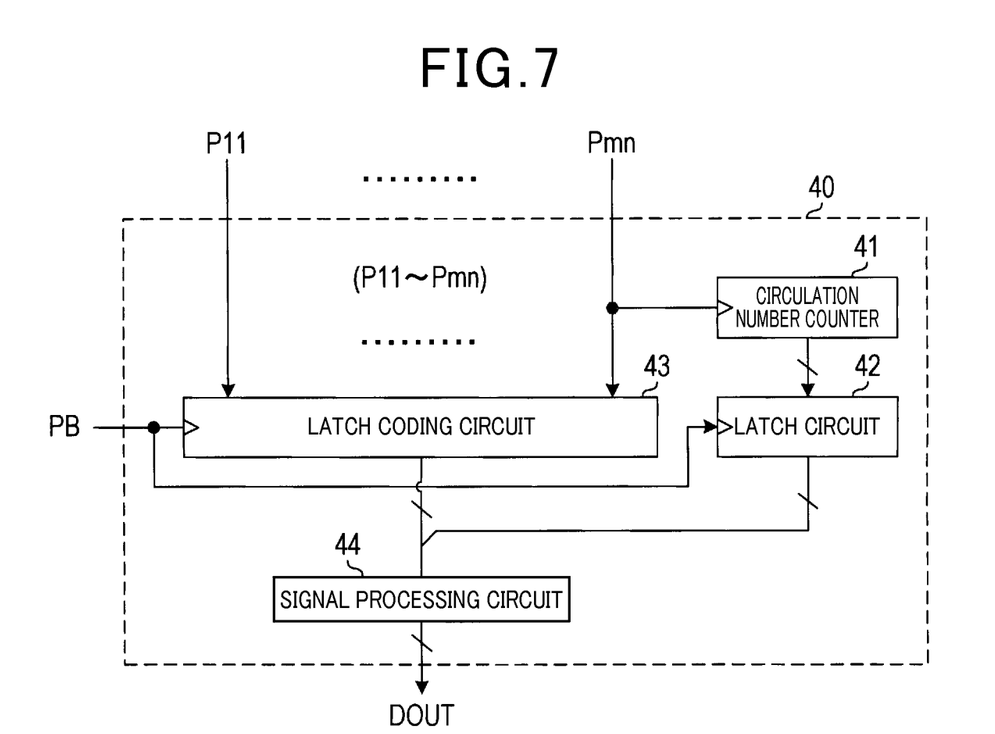
FIG. 7 is a block diagram showing a configuration of a pulse phase contrast coding circuit.

Specifically, as shown in FIG. 7, the period measurement section 40 includes a circulation number counter 41, a latch circuit 42, a latch coding circuit 43, and a signal processing circuit 44. The circulation number counter 41 counts the number of circulations of a pulse signal circulating in the ring delay circuit 10. The latch circuit 42 latches an output of the circulation number counter 41 at the rising timing of the reference signal PB. The latch coding circuit 43 latches the shift signals P11 to Pmn at the rising timing of the reference signal PB and codes the position of the pulse signal into binary data having (p+q) bits according to the latched result. The signal processing circuit 44 stores a measurement value whose high-order bits are a value latched by the latch circuit 42 and whose low-order bits are a value of (p+q) bits coded by the latch coding circuit 43, and outputs the difference between the measurement value and a previous measurement value as the reference period data DOUT.

That is, the period measurement section 40 outputs the reference period data DOUT expressing a period of the reference signal PB in an integer value in units of 1/n of the delay time Td in the delay element DU configuring the ring delay circuit 10.

<Control Data Generation Section>

Returning to FIG. 6, the control data generation section 50 performs calculation which uses a set value MN expressing a multiplication number or a dividing number as a divisor or a multiplier and uses the reference period data DOUT as a dividend or a multiplicand, to generate the control data CD expressing an output period of the output pulse signal POUT.

<Advantages>

As described above, since the frequency variable oscillator 2 is configured by using the digital controlled oscillator 1 of the first embodiment, advantages similar to those of the digital controlled oscillator 1 can be obtained.

It will be appreciated that the present invention is not limited to the configurations described above, but any and all modifications, variations or equivalents, which may occur to those who are skilled in the art, should be considered to fall within the scope of the present invention.

Hereinafter, aspects of the above-described embodiments will be summarized.

The digital controlled oscillator includes a ring delay circuit (10), a timing signal generation section (20), and an output signal generation section (30).

The ring delay circuit includes delay elements connected in ring shape, the number of the delay elements being m (m is an integer of 2 or more), and transmits a pulse signal with delay. The timing signal generation section generates a timing signal corresponding to timing selection data from passing signals outputted from the delay elements, in accordance with the timing selection data specifying any of timings which are obtained by dividing a circulation period of the pulse signal in the ring delay circuit by m×n (n is an integer of 2 or more). Note that, the timing signal generation section generates the timings obtained by dividing the circulation period by m×n by using at least one pulse edge shift circuit (ES1 to ESm, ES) which generates shift signals, the number of which is n, and whose timings differ from each other by a unit delay time from one input signal, the unit delay time being 1/n of delay time in the delay element. An output signal generation section sets the timing selection data based on control data specifying a period of an output pulse signal and the timing selection data every time when the output pulse signal is outputted, and generates the output pulse signal in accordance with the timing selection data by using the timing signal outputted from the timing signal generation section.

According to the configuration, n-fold frequency resolution can be realized which is n times higher than a frequency resolution which would be determined solely by delay time in a delay element.

In addition, all the devices can be configured by digital circuits. Hence, compared with a configuration having analog circuits and digital circuits, the circuit area and power consumption can be decreased, and an operation at a higher temperature is possible. In addition, further higher resolution can be realized as further miniaturization of IC devices develops.

What is claimed is:

1. A digital controlled oscillator, comprising:
a ring delay circuit which includes delay elements connected in ring shape, the number of the delay elements being m (m is an integer of 2 or more), and which transmits a pulse signal with delay;
a timing signal generation section which generates a timing signal corresponding to timing selection data from passing signals outputted from the delay elements, in accordance with the timing selection data specifying any of timings which are obtained by dividing a circulation period of the pulse signal in the ring delay circuit by m×n (n is an integer of 2 or more); and
an output signal generation section which sets the timing selection data based on control data specifying a period of an output pulse signal and the timing selection data every time when the output pulse signal is outputted, and generates the output pulse signal in accordance with the timing selection data by using the timing signal outputted from the timing signal generation section, wherein
the timing signal generation section generates the timings obtained by dividing the circulation period by m×n by using at least one pulse edge shift circuit which generates shift signals, the number of which is n, and whose timings differ from each other by a unit delay time from one input signal, the unit delay time being 1/n of delay time in the delay element.

2. The digital controlled oscillator according to claim 1, wherein
the timing signal generation section includes:
the pulse edge shift circuits, the number of which is m, and which are provided so as to correspond to the respective passing signals; and
a selection circuit which selects one of shift signals, the number of which is m×n, and which is outputted from the pulse edge shift circuits, the number of which is m, in accordance with the timing selection data.

3. The digital controlled oscillator according to claim 1, wherein
the timing signal generation section includes:
a first selection circuit which selects one of the passing signals, the number of which is m, in accordance with the timing selection data,
one of the pulse edge shift circuits which receives the passing signal selected by the first selection circuit; and
a second selection circuit which selects one of the shift signals outputted from the pulse edge shift circuit in accordance with the timing selection data.

4. The digital controlled oscillator according to claim 1, wherein
the pulse edge shift circuit is configured by shift amount adjustment elements, the number of which is n, and whose delay times are different from each other.

5. The digital controlled oscillator according to claim 4, wherein
each of the shift amount adjustment elements is configured by a CMOS inverter gate circuit, and delay time of the shift amount adjustment element is set by adjusting gate length of a P-channel transistor configuring the CMOS inverter gate circuit.

6. The digital controlled oscillator according to claim 1, wherein
the ring delay circuit includes the delay elements, the number of which is $m=2^p$ (p is a positive integer),
the pulse edge shift circuit generates the shift signals, the number of which is $n=2^q$ (q is a positive integer),
the output signal generation section includes an adder which adds the timing selection data to the control data, and a counter which counts the number of circulations of the pulse signal in the ring delay circuit, and
the output signal generation section outputs low-order (p+q) bits of output of the adder as the timing selection data and uses remaining high-order bits of output of the adder as circulation number data to generate the output pulse signal by using a timing signal outputted from the timing signal generation section after circulations, the number of which is counted by the counter, and which corresponds to the circulation number data.

7. A frequency variable oscillator, comprising:
the digital controlled oscillator according to claim 1;
a period measurement section which receives a predetermined reference signal and generates reference period data, which is obtained by coding a period of the reference signal by using the reference period data, and
a control data generation section which performs calculation using a set value expressing a multiplication number or a dividing number as a divisor or a multiplier and using the reference period data as a dividend or a multiplicand, to generate the control data.

* * * * *